(12) United States Patent  
Yoon

(10) Patent No.: US 6,320,249 B1  
(45) Date of Patent: Nov. 20, 2001

(54) MULTIPLE LINE GRIDS INCORPORATING THEREIN CIRCUIT ELEMENTS

(75) Inventor: Chong Kwang Yoon, Seoul (KR)

(73) Assignee: Glotech, Inc., Seoul (KR)

( * ) Notice: Subject to any disclaimer, the term of this patent is extended or adjusted under 35 U.S.C. 154(b) by 0 days.

(21) Appl. No.: 09/451,450

(22) Filed: Nov. 30, 1999

(51) Int. Cl.[7] .............. H05K 7/02; H05K 1/16; H01L 23/12; H01L 23/48

(52) U.S. Cl. .......... 257/678; 257/737; 257/738; 257/772; 257/778; 257/668; 257/686; 257/685; 257/774; 257/758; 257/700; 257/780; 361/782; 361/766; 361/734; 361/301; 361/735; 361/729; 174/250; 174/252; 174/260; 174/261

(58) Field of Search ................ 257/678, 777–781, 257/774, 737, 738, 734, 668, 686, 685, 723, 701, 700, 758; 361/782, 301, 766, 303, 734, 306, 735, 729; 174/250, 252, 240, 261

(56) References Cited

U.S. PATENT DOCUMENTS 4,803,595 * 2/1989 Kraus et al. .................. 361/412  
5,177,594 * 1/1993 Chance et al. ................ 257/701  
5,629,838 * 5/1997 Knight et al. ................. 361/782  
5,977,640 * 11/1999 Bertin et al. .................. 257/777

* cited by examiner

Primary Examiner—Alexander O. Williams  
(74) Attorney, Agent, or Firm—Rosenman & Colin, LLP

(57) ABSTRACT

A multiple line grid (MLG) for use in a multiple line grid array(MLGA) packaging incorporates therein circuit elements, e.g., metal lines, resistors, capacitors, inductors, transistors or combinations thereof, with a view to reducing a size of a printed circuit board on which it is mounted. The MLGA package includes a semifinished package including a surface with a first metal pattern formed thereon for connecting a number of input/output terminals, a printed circuit board(PCB) including a top surface with a second metal pattern formed thereon according to the first metal pattern; and at least of a MLG which is disposed between the semifinished package and the PCB. The MLG includes a non-conductive body incorporated therein a plurality of circuit elements and multiple number of conductors in the form of a column. Each of the conductors is electrically isolated from each other and is electrically connected to the first and the second metal patterns.

15 Claims, 4 Drawing Sheets

US 6,320,249 B1

MULTIPLE LINE GRIDS INCORPORATING THEREIN CIRCUIT ELEMENTS

FIELD OF THE INVENTION

The present invention relates to an integrated circuit(IC) packaging; and, more particularly, to a multiple line grid array(MLGA) package including therein multiple line grids (MLGs), the MLGs incorporating therein circuit elements such as metal lines, resistors, inductors, capacitors, transistors or combinations thereof.

DESCRIPTION OF THE PRIOR ART

One of the most noticeable design trend in electronics industry nowadays is toward miniaturization through integration and densification of the circuit elements, and one of the technologies being developed to achieve this end is surface mount technology(SMT) which is being employed as a cost-effective means of mounting IC devices to printed circuit boards(PCBs). Numerous different techniques for mounting integrated circuit devices to circuit boards, chip carriers, or other components fall within the general category of SMT. Of these techniques, area array(as opposed to perimeter array) technology is often used to mount high I/O density packages with a great degree of reliability and manufacturing efficiency. Area array techniques include the use of pin grid array(PGAs), column grid arrays(CGAs), and ball grid arrays (BGAs). The more recent BGA and CGA techniques provide substantial improvements over PGA methods in that higher densities, reliability, and efficiency can be obtained for many types of packages.

As the name implies, ball grid arrays(BGAs) utilize a grid or array of electrical terminals, such as solder balls arranged on one side of the IC package to effectuate electrical contact with the circuit board The solder balls of the array may vary in material, size(height and width) and pitch(i.e., ball-to-ball spacing) according to the individual package. Additionally, the solder balls may be arranged in a uniform or a non-uniform array pattern, with some leads removed in certain areas, which is referred to as "depopulation", depending on the desired attributes of the package. Solder balls are typically attached to the board or module using lead/tin eutectic solder balls, thereby allowing removal and rework without damage to the components There is shown in FIG. 1 a typical prior art surface mount of a flip-chip type BGA package 200 on a printed circuit board 202, showing the solder joints 203 formed between the balls 311 of the BGA and the lands 220 on PCB 202

Although the above described BGA packaging has become one of the most popular packaging alternatives for a semiconductor device with high I/O terminals in the art, however, the conventional BGA packaging is saddled with a number of problems, one of them being, that as the I/O density increases, the number of the solder balls required increases, resulting in requiring the size of the solder balls and the standoff height thereof to be reduced accordingly, the former resulting in making the proper alignment difficult and the latter, resulting in making it difficult for the heat generated by the chip to be efficiently extracted. To alleviate the above stated problems of the BGA packaging, a multiple line grid array(MLGA) package has been introduced, which is disclosed in a copending commonly owned application, U.S. Ser. No. 09/203,196, entitled "Multiple Line Grid Array Package" and incorporated herein as a reference.

However, in spite of the recent developments in SMT, the miniaturization effort is still hindered by the presence of circuit elements such as resistors, capacitors, inductors, transistors or combinations thereof which are usually mounted on the PCB along with IC devices. In other word, if means for reducing the number of circuit elements present on the PCB can somehow be found, then it will make a further miniaturization possible.

With a view to reducing the number of circuit elements present on the PCB, there has been suggested to embed the circuit elements into the package substrate in case of the BGA packaging. However, in the case of a flip-chip type BGA packaging without a package substrate, the problem described hereinabove still remains to be solved.

SUMMARY OF THE INVENTION

It is, therefore, a primary object of the present invention to provide a multiple line grid array(MLGA) package including multiple line grids (MLGs), the MLGs incorporating therein circuit elements, e.g., metal lines, resistors, capacitors, inductors, transistors or a combination thereof.

In accordance with one aspect of the present invention, there is provided a multiple line grid array package comprising: a semifinished package including a surface, wherein a first metal pattern is formed on the surface for connecting a number of input/output terminals; a printed circuit board including a top surface, wherein a second metal pattern is formed on the top surface according to the first metal pattern; and at least of a multiple line grid, disposed between the semifinished package and the printed circuit board, including a non-conductive body incorporated therein a plurality of circuit elements and multiple number of conductors in the form of a column, each of the conductors being electrically isolated from each other and being electrically connected to the circuit elements, the first and the second metal patterns.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

Figure 1:
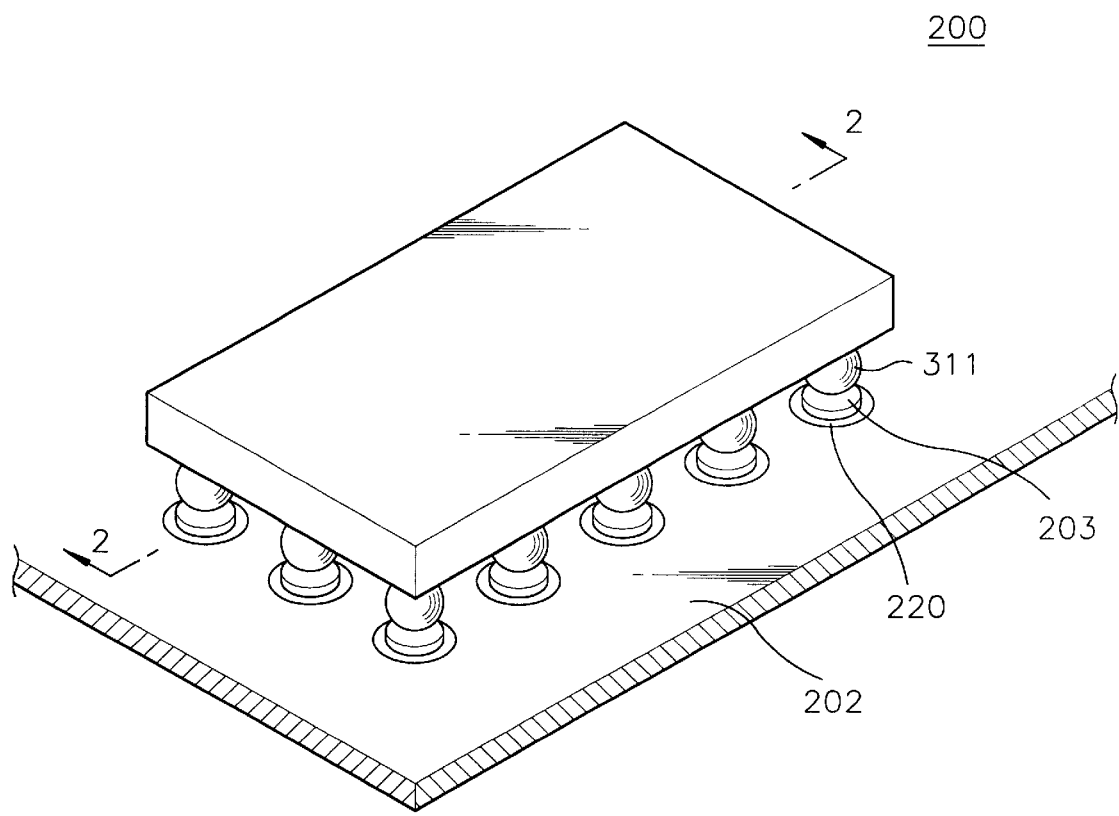
FIG. 1 is a perspective view of a conventional flip-chip type ball grid array package.
Figure 2:
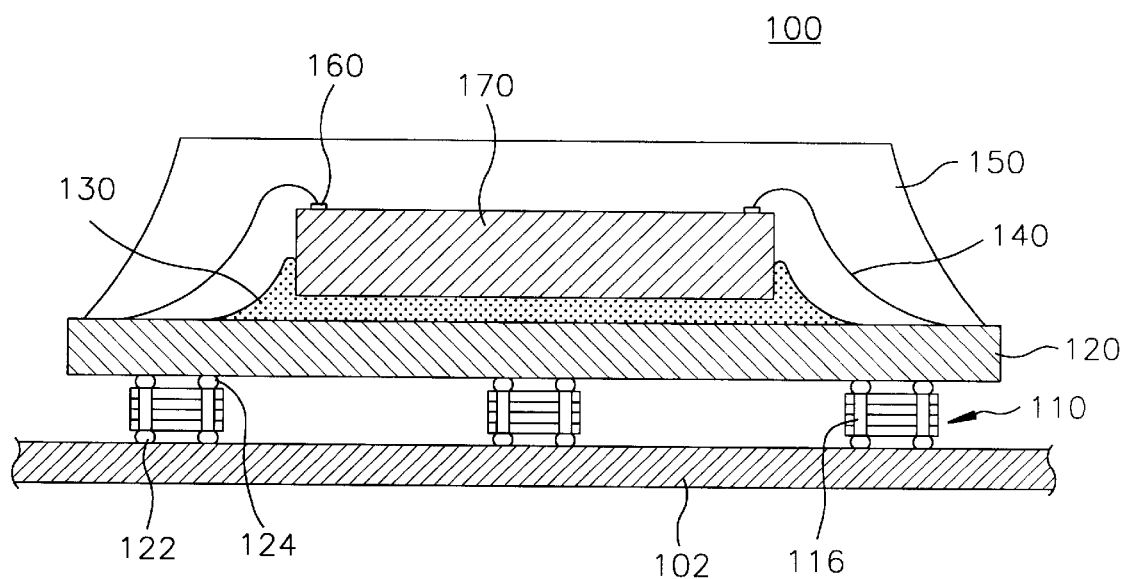
FIG. 2 shows a schematic cross-sectional view of one type of multiple line grid array package mounted on a printed circuit board in accordance with preferred embodiments of the present invention.

In FIG. 2, there is provided a schematic cross-sectional view of a multiple line grid array(MLGA) package 100 in accordance with preferred embodiments of the present invention, the MLGA package 100 mounted on a printed circuit board(PCB) 102 comprising an IC component 170 including a plurality of wire bonding pads 160, an array of multiple line grids(MLGs) 110 having a number of conductors 116, and a package substrate 120 formed by stacking a number of substrate layers for electrically connecting the IC component 170 to the array of MLGs 110.

The package substrate 120 is a non-conductive substrate provided with a top and a bottom surfaces, a first pattern formed on the bottom surface and a second pattern formed on the top surface. The first and the second patterns are designed in such a way that the wire bonding pads 160 of the IC component 170 are electrically connected to the array of MLGs 110 according to an input/output(I/O) terminal design.

The IC component 170 is mounted on top of the package substrate 120 by applying therebetween a polymeric adhesive 130 including therein, e.g., a silver paste and the like. Gold wires 140 are wire-bonded from the wire bonding pads 160 of the IC component 170 to metallization areas of the second pattern of the package substrate 120 for electrically connecting the array of MLGs 110 to the package substrate 120. The wire-bonded IC component 170 is encapsulated by a material such as a mold compound 150 in order to protect the IC component 170 from detrimental environmental effects such as moisture or the like.

In the preferred embodiments of the present invention, a first pattern of solder paste 124 is formed on the first pattern of the package substrate 120 in line with the configuration of conductors 116. The first pattern of solder paste 124 is formed by using a process such as a screen printing. The MLGA package 100 is mounted on the PCB 102 in such a way that ends of the conductors 116 of the MLGs 110 are aligned with the second pattern of the solder paste 122. The ends of conductors 116 of the MLGs 110 are electrically connected to the first pattern of the package substrate 120 through the use of the first pattern of the solder paste 124.

Figure 3:
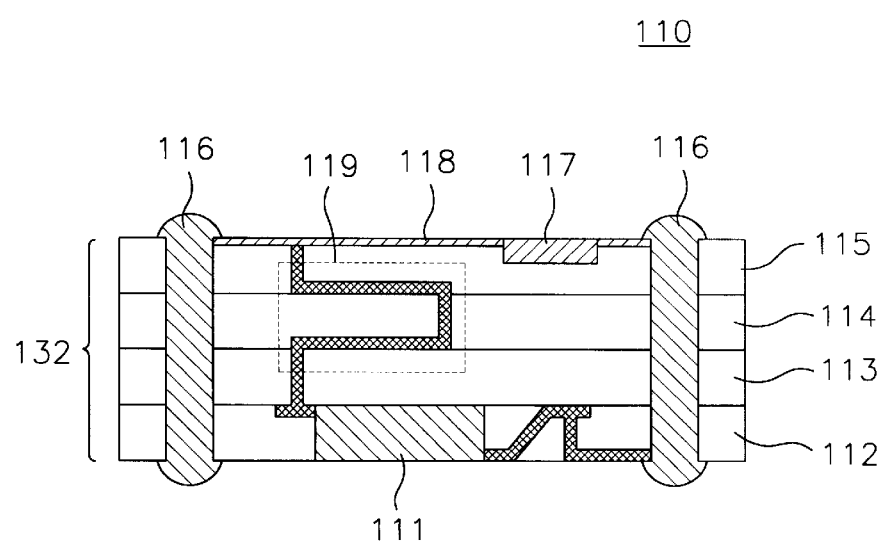
FIG. 3 depicts a partially enlarged cross-sectional view of one of the multiple line grids in accordance with a first preferred embodiment of the present invention.

In FIG. 3, there is depicted a partially enlarged cross-sectional view of a MLG 110 for use in a MLGA package in accordance with one embodiment of the present invention.

The MLG 110 further includes a grid body 132 formed by laminating a number of layers 112 to 115 and circuit elements such as resistors 117, metal lines 118, capacitors 111 and inductors 119 integrated into the grid body 132. Each of the layers 112 to 115 is made of an insulating material such as a ceramic, a polymer, a composite of ceramic and polymer and the like.

In the preferred embodiment of the present invention, although the capacitor 111 is formed into the layer 112 of the MLG 110, the inductor 119 is formed into the layers 113 to 115 and the resistor 117 and metal lines 118 are formed on top of the layer 115, it is possible that any type of circuits elements such as resistors, metal lines, capacitors, inductors or combinations thereof may be formed in the layers 112 to 115, respectively.

The conductors 116 in the form of a column is made of a conductive material such as a solder paste and protrudes outwardly from top and bottom surfaces of the grid body 132 in order to electrically connect the package substrate 120 with the PCB 102.

Referring back to FIG. 2, a second pattern of solder paste 122 is formed on the PCB 102 in line with the configuration of the conductors 116. The second pattern of the solder paste 122 is formed by using a process such as a screen printing.

Figure 4:
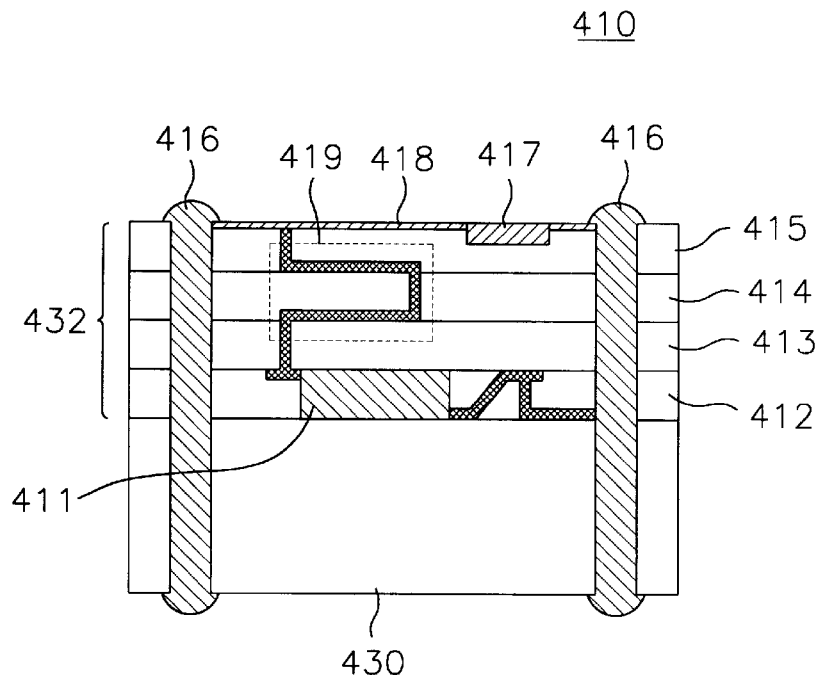
FIG. 4 illustrates a partially enlarged cross-sectional view of one of the multiple line grids in accordance with a second preferred embodiment of the present invention.

Alternatively, in FIG. 4, there is shown a partially enlarged cross-sectional view of a MLG 410 in accordance with a second preferred embodiment of the present invention. The inventive MLG 410 is similar to the MLG 110 shown in FIG. 3 except that a grid body 432 provided with a number of layers 412 to 415 and circuit elements 411, 417, 418, 419 integrated thereinto is formed on top of a body plate 430 and the layers and the body plate are made of a semiconductor, e.g., silicon. The conductors 416 in the form of a column is made of a conductive material such as a solder paste and extended from a top surface of the grid body 432 to a bottom surface of the body plate 430 in order to electrically connect the package substrate 120 with the PCB 102.

Figure 5A:
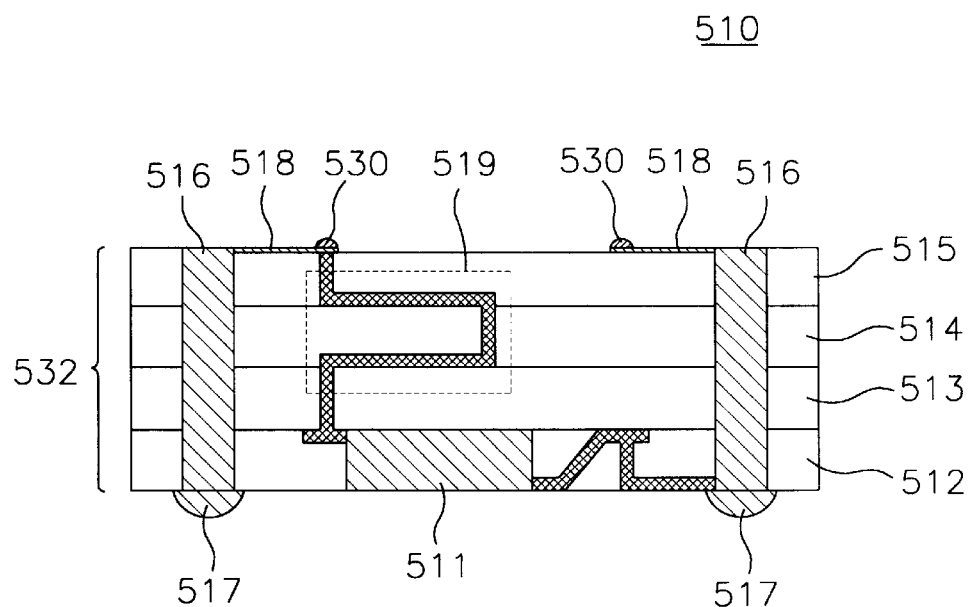
FIG. 5A represents a schematic cross-sectional view one of the multiple line grids in accordance with a third preferred embodiment of the present invention.
Figure 5B:
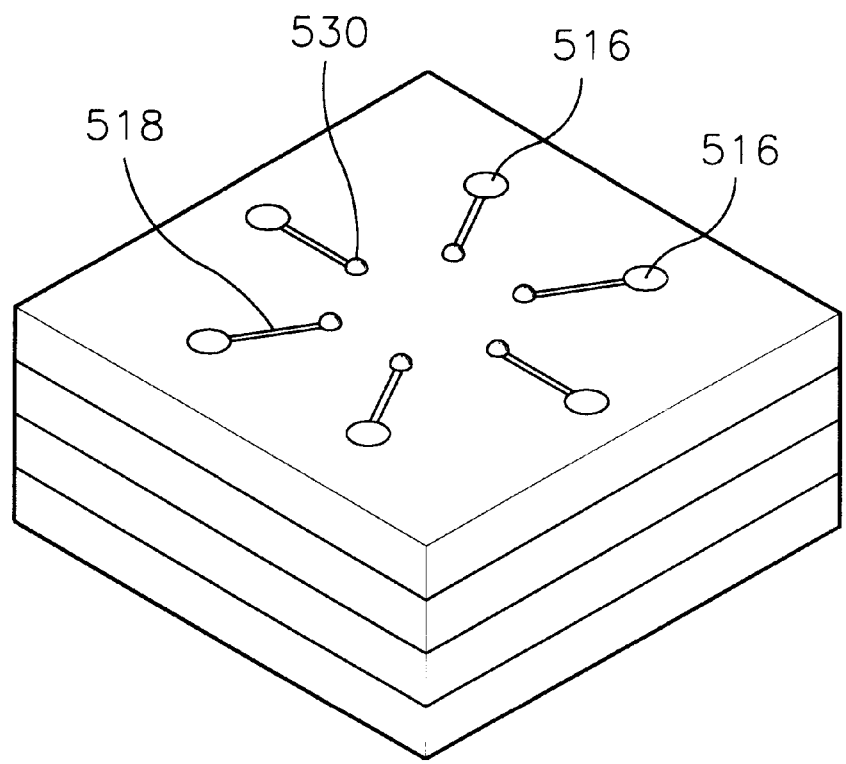
FIG. 5B presents a perspective view of the multiple line grid shown in FIG. 5A.

Also, in FIGS. 5A and 5B, there are shown a partially enlarged cross-sectional view of a MILG 510 in accordance with a third preferred embodiment of the present invention and a perspective view of the multiple line grid shown in FIG. 5A. The inventive MLG 510 is similar to the MLG 110 shown in FIG. 3 except that an upper layer 515 is provided with a set of solder bumps 530 and a set of metal lines 518 to connect each of the solder bumps 530 with the conductors 516, respectively, as shown in FIG. 5B. In the third preferred embodiment, the is solder bumps 530 formed on top of the upper layer 515 are different in size from the solder bumps 517 formed on the conductor 516 and a lower layer 512. Further, the solder bumps 530 can be designed in such a way that pattern thereof is different from that of the solder bumps 517 to make them compatible with various types of bumps on an IC component.

This embodiment is particularly advantageous in packaging an IC component, e.g., a flip-chip, a wafer level package or the like, in which the bumps on the IC are located peripherally or centrally.

While the present invention has been described with respect to the preferred embodiments, other modifications and variations may be made without departing from the spirit and scope of the present invention as set forth in the following claims.

What is claimed is:

1. A multiple line grid array package comprising
   at least one multiple line grid including a non-conductive body incorporating therein a plurality of circuit elements and multiple number of conductors in the form of a column, the conductors being electrically isolated from each other; and
   a semifinished package including a surface with a first metal pattern formed thereon and disposed above the multiple line grids, the first metal pattern being electrically connected to the conductors of the multiple line grids.

2. The multiple line grid array package of claim 1, wherein the non-conductive body is formed by laminating a number of layers.

3. The multiple line grid array package of claim 2, wherein the non-conductive body incorporates therein at least one circuit element.

4. The multiple line grid array package of claim 3, wherein the circuit element is selected from the group consisting of metal lines, resistors, capacitors, inductors, transistors and combinations thereof.

5. The multiple line grid array package of claim 4, wherein the non-conductive body is formed from the group consisting of a ceramic, a polymer, a silicon or a composite material of ceramics and polymer.

6. The multiple line grid array package of claim 5, wherein the non-conductive body formed by laminating the layers further includes a body plate for mounting the laminated layers.

7. The multiple line grid array package of claim 1, further comprising a first patterned layer of solder formed between the first metal pattern of the semifinished package and ends of the conductors of the multiple line grids.

8. The multiple line grid array package of claim 7, wherein the first patterned layer is formed by a screen printing method.

9. The multiple line grid array package of claim 1, wherein the semifinished package includes a package substrate formed by laminating a number of layers and an integrated circuit component integrated into the package substrate.

10. The multiple line grid array package of claim 1, wherein the multiple line grid further includes a first set of solder bumps and metal lines on top thereof and a second set of solder bumps on bottom thereof, the first set of the solder bumps being different in size from the second set of the solder bumps.

11. The multiple line grid array package of claim 10, wherein an arrangement or a pattern of the first set of the solder bumps are different from that of the second set of solder bumps.

12. The multiple line grid array package of claim 11, wherein the semifinished package is a flip-chip.

13. The multiple line grid array package of claim 12, wherein the semifinished package is a wafer level package.

14. The multiple line grid array package of claim 9, wherein an IC component incorporated into the package substrate of the semifinished package includes a plurality of wire bonding pads and the package substrate further includes a top and a bottom surfaces, the first metal pattern being formed on the bottom surface and a second metal pattern being formed on the top surface thereof, the first metal pattern in conjunction with the second metal pattern allowing the wire bonding pads of the IC component to be electrically connected to the conductors of the multiple line grid.

15. The multiple line grid array package of claim 14, wherein gold wires are wire-bonded from the wire bonding pads of the IC component to metallization areas of the second metal pattern of the package substrate.

* * * * *